(12) United States Patent
Li et al.

(10) Patent No.: US 9,960,327 B2
(45) Date of Patent: May 1, 2018

(54) LIGHT EMITTING DEVICE AND DISPLAY EQUIPMENT

(71) Applicants: HISENSE ELECTRIC CO., LTD., Qingdao, Shandong (CN); HISENSE USA CORPORATION, Suwanee, GA (US); HISENSE INTERNATIONAL CO., LTD., Qingdao, Shandong (CN)

(72) Inventors: Xiaoping Li, Shandong (CN); Fulin Li, Shandong (CN); Kun Shao, Shandong (CN)

(73) Assignees: Hisense Electric Co., Ltd., Qingdao, Shandong (CN); Hisense USA Corporation, Suwanee, GA (US); Hisense International Co., Ltd., Qingdao, Shandong (CN)

( * ) Notice: Subject to any disclaimer, the term of this patent is extended or adjusted under 35 U.S.C. 154(b) by 292 days.

(21) Appl. No.: 14/672,775

(22) Filed: Mar. 30, 2015

(65) Prior Publication Data

US 2016/0102838 A1 Apr. 14, 2016

(30) Foreign Application Priority Data

Oct. 9, 2014 (CN) .......................... 2014 1 0527458

(51) Int. Cl.
*F21V 3/00* (2015.01)
*F21V 5/00* (2015.01)
(Continued)

(52) U.S. Cl.
CPC .......... *H01L 33/58* (2013.01); *G02B 19/0061* (2013.01)

(58) Field of Classification Search
CPC ..... F21K 9/00; F21K 9/60; F21K 9/66; F21K 9/69; F21V 5/007; F21V 5/04;
(Continued)

(56) References Cited

U.S. PATENT DOCUMENTS 9,666,772 B2 * 5/2017 Ibbetson ................. H01L 33/54
2007/0091615 A1 * 4/2007 Hsieh ....................... G02B 3/00
362/335

FOREIGN PATENT DOCUMENTS

CN 1858635 11/2006
CN 101482669 7/2009
(Continued)

*Primary Examiner* — Jason Moon Han
(74) *Attorney, Agent, or Firm* — Boyle Fredrickson, S.C.

(57) ABSTRACT

Embodiments of the present disclosure provide a light emitting device and display equipment. The light emitting device, includes a light emitting diode (LED) and an optical lens, the optical lens including a light incident surface and a light emergent surface, the light incident surface including a free-form convex surface; wherein there is a first angle between a symmetry axis and the connecting line between the center point of the light emitting surface and any point on the light incident surface, and the curvature of the light incident surface decreases with the increase of the first angle; there is a second angle between a symmetry axis and the connecting line between the center point of the light emitting surface and any point on the light emergent surface, and the curvature of the light emergent surface increases with the increase of the second angle.

12 Claims, 8 Drawing Sheets

(51) Int. Cl.
*H01L 33/58* (2010.01)
*G02B 19/00* (2006.01)
(58) Field of Classification Search
CPC ..... F21V 5/046; F21V 5/048; G02B 19/0009;
G02B 19/0014; G02B 19/0047; G02B
19/0061; G02B 19/0066; G02B 19/0071;
H01L 33/58
USPC ........................................ 362/249.02, 311.02
See application file for complete search history.

(56) References Cited

FOREIGN PATENT DOCUMENTS

| | | |
|---|---|---|
| CN | 101617252 | 12/2009 |
| CN | 101776242 | 7/2010 |
| CN | 101988644 | 3/2011 |
| CN | 103062707 | 4/2013 |

\* cited by examiner

LIGHT EMITTING DEVICE AND DISPLAY EQUIPMENT

CROSS-REFERENCES TO RELATED APPLICATION

This application claims priority to Chinese Patent Application No. 201410527458.2, filed with the Chinese Patent Office on Oct. 9, 2014, the content of which is hereby incorporated by reference in its entirety.

FIELD the present disclosure, relates to the technical field of display, and more particularly to a light emitting device and display equipment.

BACKGROUND

A liquid crystal display (LCD) has been widely applied to such electronic products with a display function as mobile phones, computers, TV and the like. It is well known that the LCD needs a backlight to perform display. Characterized by being small in volume, low in power consumption, long in service life, wide in color gamut and the like a light emitting diode (LED) has become the main source of the LCD backlight source. However, since the LED has such inherent disadvantages as being small in light emitting angle, bad in uniformity and the like, the backlight source formed by LED has such problems in use as uneven display brightness and the like.

SUMMARY

In one aspect, the present disclosure provides a light emitting device, including a light emitting diode (LED) and an optical lens, the LED including a light emitting surface, the optical lens being a rotating symmetric body arranged above the LED, the optical lens including a light incident surface and a light emergent surface, wherein the light incident surface includes a free-form concave surface, the light emergent surface includes a free-form convex surface, wherein in the case where a symmetry axis of the optical lens goes through a centre point of the light emitting surface of the LED, there is a first angle formed between the symmetry axis and a connecting line between the center point of the light emitting surface and any point on the light incident surface, and a curvature of the light incident surface decreases with an increase of the first angle; there is a second angle between the symmetry axis and a connecting line between the center point of the light emitting surface and any point on the light emergent surface, and a curvature of the light emergent surface increases with an increase of the second angle, wherein the first angle and the second angle are not greater than 90°.

In another aspect, the present disclosure provides a display equipment, including a light emitting source and an optical lens, the light emitting source including a light emitting surface, the optical lens being a rotating symmetric body arranged above the light emitting source, the optical lens including a light incident surface and a light emergent surface, wherein the light incident surface includes a free-form concave surface, and the light emergent surface includes a free-form convex surface:
in the case where a symmetry axis of the optical lens goes through a centre point of the light emitting surface of the light emitting source, there is a first angle between the symmetry axis and a connecting line between the center point of the light emitting surface and any point on the light incident surface, and a curvature of the light incident surface decreases with an increase of the first angle; there is a second angle between the symmetry axis and a connecting line between the center point of the light emitting surface and any point on the light emergent surface, and a curvature of the light emergent surface increases with an increase of the second angle.

The present disclosure further provides a light emitting device, including a light emitting source and an optical lens, the light emitting source including a light emitting surface, the optical lens being arranged above the light emitting source, the optical lens including a light incident surface and a light emergent surface, the light incident surface including a first curved surface, the light emergent surface including a second curved surface corresponding to the first curved surface;
wherein the first and second curved surfaces are consistent in bending direction, and in at least one of planes perpendicular to the light emitting surface, the curvature variation trends of at least part of the first and second curved surfaces corresponding to each other are opposite to each other.

BRIEF DESCRIPTION OF THE DRAWINGS

In order to more clearly illustrate the technical solutions in the present disclosure or the prior art, given below is a brief introduction about the accompanying drawings required to be used for illustration of the embodiments or the prior art; obviously, the accompanying drawings illustrated below are merely some embodiments of the present disclosure, for those ordinary skilled in the art, it is also possible to derive other drawings according to these drawings without creative efforts, wherein.

REFERENCE NUMBERS

10—light emitting diode;
100—light emitting device;
101—light emitting surface;
11—symmetry axis;
20—substrate;
30—optical lens;
31—light incident surface;
31a—first optical action area;
31b—second optical action area
32—light emergent surface;
32a—first emergent surface;
32b—second light emergent surface;
32c—third light emergent surface;
320—free-form convex surface;
33—bottom surface;
330—supporting foot;
34—straight surface;
35—inclined plane;
36—reflector plate;
40—first angle;
41—second angle;
42—first distance;
43—second distance;
44—third distance;
45—fourth distance.

DETAILED DESCRIPTION OF THE EMBODIMENTS

The technical solution in embodiments of the present disclosure will be described clearly and completely below in connection with the accompanying drawings in the embodiments of the present disclosure; obviously, the embodiments illustrated are only a part but not all of the embodiments of the present disclosure. Based on the embodiments of the present disclosure, all other embodiments obtained by those skilled in the art without creative efforts are considered to be within the protection scope of the present disclosure.

It needs to be noted is that, in the embodiments of the present disclosure, the light incident surface of an optical lens refers to the surface through which the light enters into the optical lens; similarly, the light emergent surface of the optical lens refers to the surface through which the light exiting from the optical lens.

Figure 1:
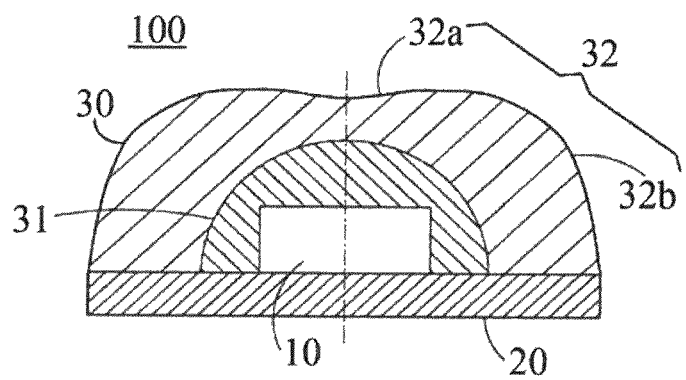
FIG. 1 is a schematic, structural diagram of a light emitting device according to an embodiment of the present disclosure.

An embodiment of the present disclosure is as shown in FIG. 1, the light emitting device 100 includes a light emitting diode (LED) 10, a substrate 20 and an optical lens 30, wherein optical lens 30 includes a light incident surface 31 which is a hemispherical groove and a light emergent surface 32, the LED 10 is located in the hemispherical groove of the optical lens 30, the light emergent surface 32 of the optical lens 30 includes a first light emergent surface 32a and a second light emergent surface 32b. The light emitting device with this structure increases the light emitting angle and uniformity of the LED through the optical lens, but the light emitted by the LED may, after deflected by the optical lens, cause the paraxial region to be too bright, so that a bright spot may be produced on the display screen when the light emitting device is applied to the backlight source. In addition, the larger the incident angle, the smaller the ratio of the emergence angle to the incident angle, and when the incident angle is greater than the half-power angle, the emergence angle is equal to the incident angle, so a bright ring may be produced.

Figure 2:
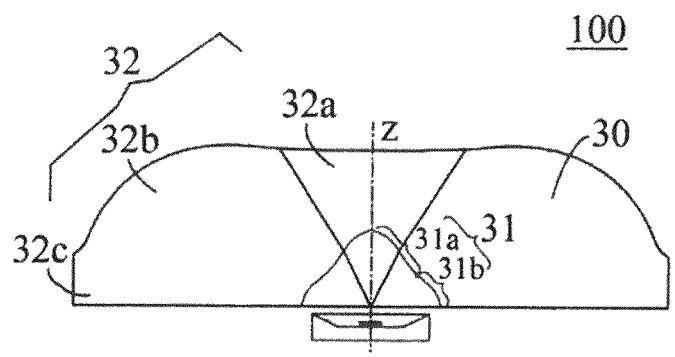
FIG. 2 is a schematic structural diagram of a light emitting device according to an embodiment of the present disclosure.
Figure 3:
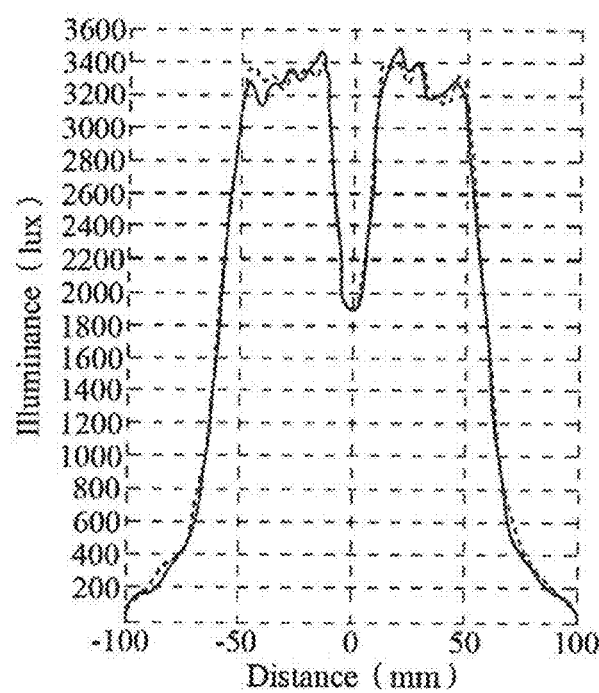
FIG. 3 is an illumination curve graph of the light emitting, device according to FIG. 2.
Figure 4:
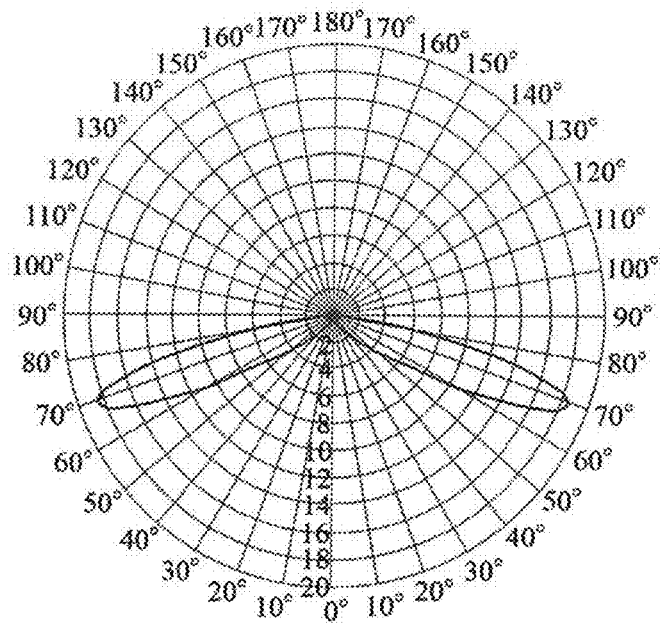
FIG. 4 is a light intensity distribution diagram in polar coordinate of the light emitting device according to FIG. 2.

Another embodiment of the present disclosure is as illustrated in FIG. 2, the light incident surface 31 of the optical lens 30 of the light emitting device 100 includes a first optical action area 31a and a second optical action area 31b, the light emergent surface 32 of the optical lens 30 is divided into a first light emergent surface 32a, a second light emergent surface 32b, and a third light emergent surface 32c. The light incident and light emergent surfaces are designed by segments for the optical lens, so a uniform light is achieved to a certain extent, hut as shown in FIG. 3, in the illumination curve graph of a light emitting device, the illuminance values in an area of approximately 10 mm-50 mm may fluctuate too much, and the illuminance values in an area of 50 mm and above may drop too steep, which may cause the display screen to have a circular fringe uneven in brightness; in addition, as shown in FIG. 4, it can be seen from the light intensity distribution diagram in polar coordinate of the light emitting device that the light emergent angle thereof is 140 degrees and the light diffusion range is small.

Figure 5:
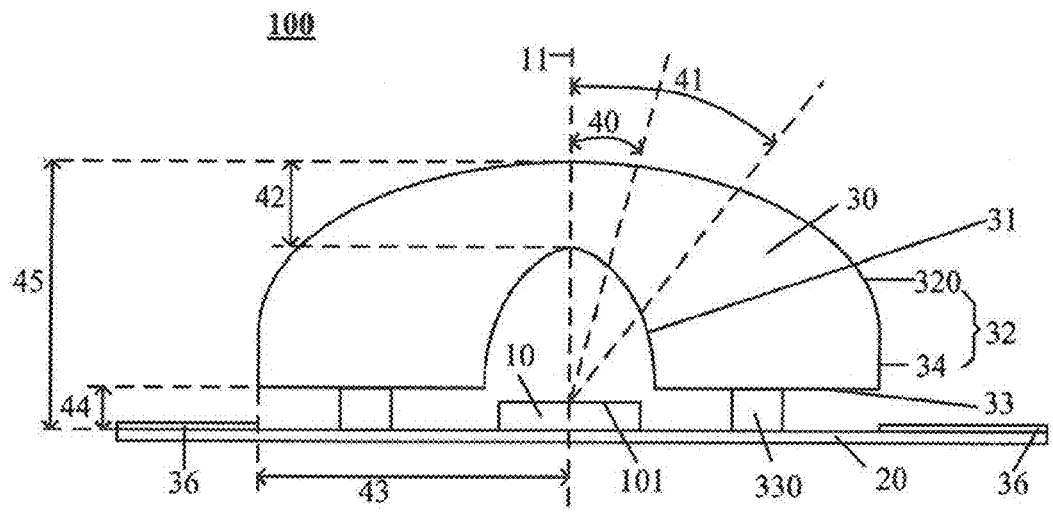
FIG. 5 is a schematic diagram of a light emitting device according to an embodiment of the present disclosure.

Another embodiment of the present disclosure provides a light emitting device 100, as shown in FIG. 5. The light emitting device 100 includes an LED 10 and an optical lens 30, the LED 10 including a light emitting surface 101, the optical lens 30 being a rotating symmetric body arranged above the LED 10, the optical lens 30 including a light incident surface 31 and a light emergent surface 32, the light incident surface 31 including a free-form concave surface, the light emergent surface 32 including a free-form convex surface 320.

As shown in FIG. 5, in the case where the symmetry axis 11 of the optical lens 30 goes through the centre point of the light emitting surface 101 of the LED 10, there is a first angle 40 between the symmetry axis 11 and the connecting line between the center point of the light emitting surface 101 and any point on the light incident surface 31, and the curvature of the light incident surface 31 decreases with the increase of the first angle 40.

As shown in FIG. 5, there is a second angle 41 between the symmetry axis 11 and the connecting line between the center point of the light emitting surface 101 and any point on the light emergent surface 32, and the curvature of the light emergent surface 32 increases with the increase of the second angle 41; wherein the first angle 40 and the second angle 41 are not greater than 90°.

In the above light emitting device, the optical lens whose symmetry axis is coincident with the optical axis is formed by rotating the cross section, which goes through the symmetry axis, a circle, and the optical lens thus formed is a rotating symmetric body. The optical lens is arranged above the LED to control the direction of the light emitted by the light emitting surface of the LED, which may be specifically as shown in FIG. 5 that the optical lens 30 is arranged above the light emitting surface 101 of the LED 10, or as shown in FIG. 1 that the LED 10 is arranged in the optical lens 30, or the like. The embodiments and drawings of the present disclosure are illustrated in details by taking the case where the optical lens is arranged above the light emitting surface of the LED as an example.

It needs to be noted that, in the embodiments of the present disclosure, the light incident surface of an optical lens includes a free-form concave surface, that is, for the optical lens, the surface of the concave part of an optical lens is the light incident surface, and the light incident surface may be a free-form concave surface; the light emergent surface of the optical lens includes a free-form convex surface, that is, for the optical lens, the surface of the convex pan of an optical lens is the light emergent surface, and the light emergent surface may be a free-form convex surface.

It needs to be further noted that, whether the symmetry axis of an optical lens goes through the centre point of the light emitting surface of the LED is not limited in the embodiments of the present disclosure, that is, the symmetry axis of an optical lens may go through the centre point of the light emitting surface of the LED or not. It is just alright if the LED is arranged at a position where the light emitting surface thereof is located on the symmetry axis of the optical lens, the optical lens meets the condition that the curvature of the light incident surface decreases with the increase of the first angle, and the curvature of the light emergent surface increases with the increase of the second angle. The embodiments of the present disclosure are only illustrated in details by taking the case where the symmetry axis of the optical lens goes through the centre point of the light emitting surface of the LED as an example.

It should be still further noted that there are three cases for the first angle between the symmetry axis and the connecting fine between the center point of the light emitting surface and any point on the light incident surface, that is the first angle is an acute angle, a right angle or an obtuse angle. In the embodiments of the present disclosure, the first angle is an acute angle or a right angle, namely the first angle is not greater than 90°. Similarly, what is for the second angle is the same as the first angle, for which unnecessary details are no longer given below.

In the embodiments of the present disclosure, the light incident surface of an optical lens is configured to be a free-form concave surface to enable the light emitted by the LED is deflected for one time, so that the brightness of the center of the light is reduced, and the curvature of the light incident surface decreases with the increase of the first angle, so the light close to the symmetry axis region has a relatively large deflection angle after going through the light incident surface with high curvature, thus the light close to the symmetry axis region is further scattered, the light intensity distribution tends to be even so as to realize the smooth transition of the illuminance. In addition, the light emergent surface of the optical lens is configured as a free-form convex surface, the curvature of the light emitting surface increases with the increase of the second angle, so that after the light goes through the light emergent surface with different curvatures, the light intensity distribution is more uniform, and the scattering angle increases, and then the diffusion range of the light increases, that is, the light emergent angle increases, thus improving the problems that the light emergent angle of the light emitting device is small, a bright spot, a bright ring and other forms of uneven display brightness appear on the display screen when the light emitting device is applied to the backlight source in the prior art.

Optionally, in order to facilitate manufacturing and fixing the optical lens, as shown in FIG. 5, the optical lens 30 further includes a bottom surface 33 connected with the light incident surface 31 and the light emergent surface 32. The bottom surface 33 may be in a frosted structure surface, which is more favorable for manufacturing.

Figure 6:
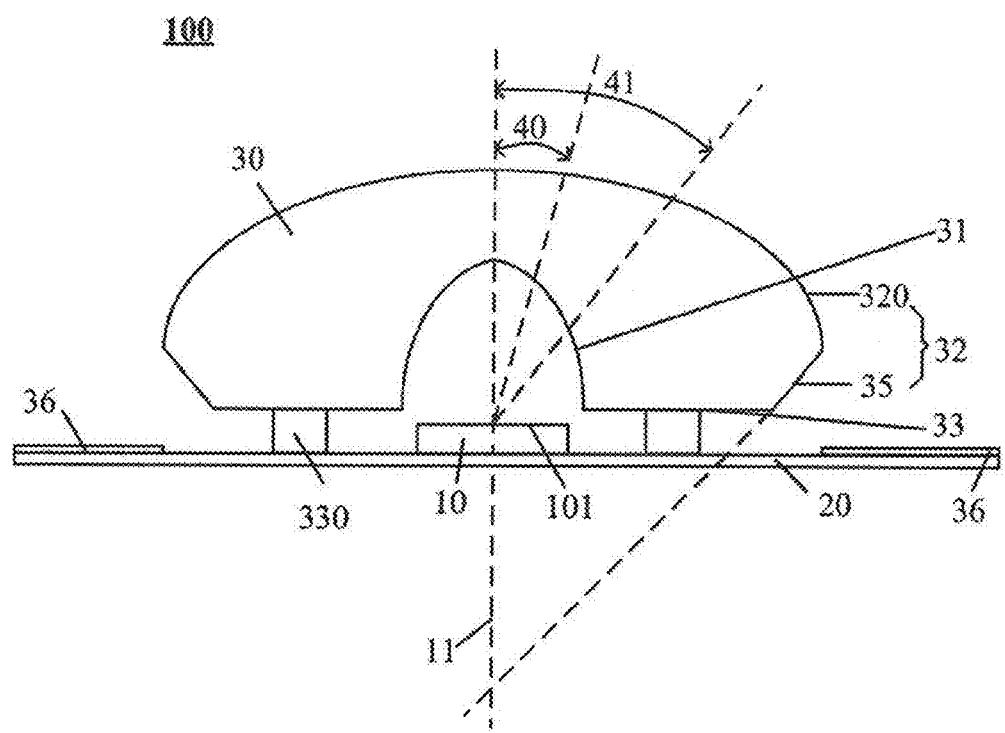
FIG. 6 is a schematic diagram of another light emitting device according to an embodiment of the present disclosure.
Figure 7:
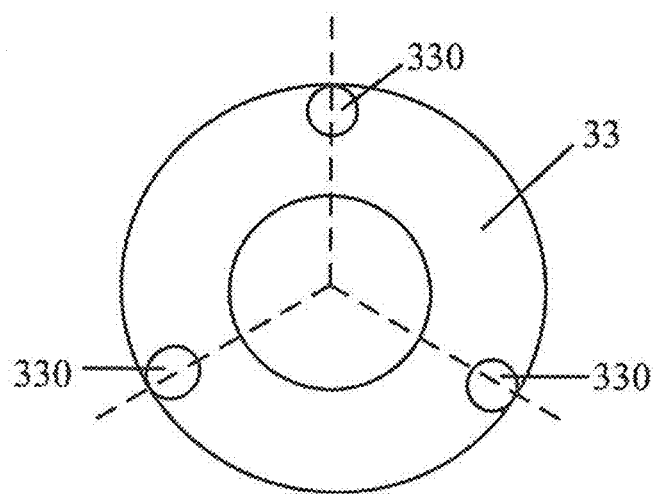
FIG. 7 is a schematic diagram of a supporting foot on the bottom surface of a light emitting device according to an embodiment of the present disclosure.

It needs to be noted that as shown in FIGS. 5-7, the optical lens 30 is arranged above the light emitting surface 101 of the LED 10, three supporting feet 330 evenly distributed on the bottom surface may further be arranged on the bottom surface 33 of the optical lens to support the optical lens 30, so that the optical lens 30 is separated by a certain space from the LED 10 to facilitate heat dissipation in the case that the LED 10 emits light for a long time, wherein a medium whose refractive index is lower than the optical lens, such as air, transparent silica gel, or other materials is filled in the space between the optical lens and the LED. Particularly, the light emitting device may include three supporting feet 330, and the three supporting feet 330 are arranged in a circular array manner as shown in FIG. 7. The number and arrangement of support feet are not limited by the embodiments of the present disclosure, and a detailed illustration is given by only taking what is shown in FIG. 7 as an example.

Further optionally, as shown in FIGS. 5-6, the light emergent surface 32 further includes a straight surface 34 or the inward inclined surface 35, which is connected with the free-form convex surface 320.

As shown in FIG. 5, the straight surface 34 connected with the bottom surface 33 is formed by rotating the straight generatrix, which is parallel to the symmetry axis of the optical lens 30, a circle. The bottom surface 33 is connected with the free-form convex surface 320 by the straight surface 34, so that the optical lens is easier to be manufactured and made.

As shown in FIG. 6, the generatrix extension line of the inward inclined surface 35 connected with the bottom surface 33 intersects with the symmetry axis 11 of the optical lens 30, and the inclined plane 35 is formed by rotating the inclined generatrix a circle, the projection of the inward inclined surface 35 on the bottom surface 33 is located within the projection area of the free-form convex surface 320 on the bottom surface 33, that is, the inward inclined surface 35 is inclined to the interior of the optical lens 30.

Figure 8:
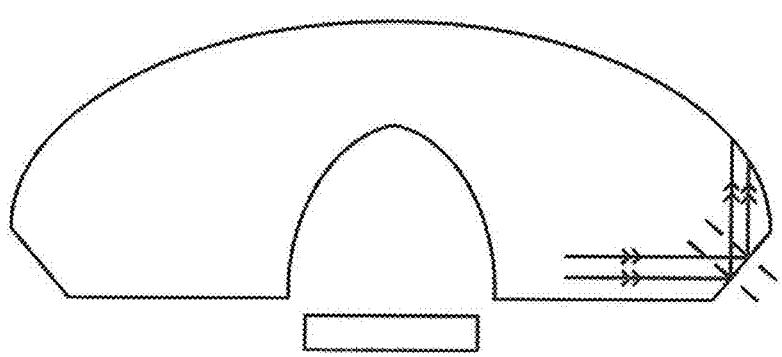
FIG. 8 is a schematic optical path diagram of a reflection occurring after a light ray nearly parallel to a bottom surface is incident to an inward inclined surface in FIG. 6.

In an embodiment, a reflector plate is arranged on the inward inclined surface. As shown in FIG. 8, the inward inclined surface may cause reflection of the light nearly parallel to the bottom surface, and then the light exits from the light emergent surface of the optical lens, so that the light nearly parallel to the bottom surface is fully utilized, and the utilization efficiency of light emitted by the LED is improved.

Optionally, as shown in FIG. 5, the light emitting device 100 further includes a substrate 20, the LED 10 being fixed on the substrate 20, a reflector plate 36 is arranged on one side of the substrate 20 where the LED 10 is fixed. The reflector plate 36 may be arranged in an area outside the projection area of the optical lens 30 on the substrate 20, and may reflect the light incident to the substrate 20, in order to improve the utilization efficiency of light emitted by the LED 10.

Optionally, in order to ensure the manufacturing precision of the optical lens and meet the requirement for thinning, as shown in FIG. 5, the distance between the point where the light incident surface 31 intersects with the symmetry axis 11 of the optical lens 30 and the point where the light emergent surface 32 intersects with the symmetry axis 11 of the optical lens 30 is a first distance 42, 0.5 mm≤the first distance≤1.5 mm; if the first distance 42 is less than 0.5 mm, then the optical lens 30 is difficult to manufacture, and if the first distance 42 is more than 1.5 mm, then the requirement for thinning cannot be met.

Optionally, in order to reduce the cost and improve the utilization efficiency of the optical lens, as shown in FIG. 5, the maximum distance between any point on the light emergent surface 32 and the symmetry axis 11 of the optical lens 30 is a second distance 43, 6.5 mm≤the second distance≤8.5 mm.

Optionally, in order to meet the heat dissipation/stability requirement of the light emitting device, as shown in FIG. 5, the minimum distance between the bottom surface 33 and the substrate 20 is a third distance 44, 0.2 mm≤the third distance≤1 mm.

Optionally, in order to meet the requirement of the light emitting device in thinning, as shown in FIG. 5, the maximum distance between any point on the light emergent surface 32 and the substrate 20 is a fourth distance 45, the fourth distance≤6.5 mm.

The light emitting device according to the embodiments of the present disclosure is illustrated in details by taking the case where the symmetry axis of the light emitting device goes through the centre point of the light emitting surface of the LED as an example.

As shown in FIG. 5, the light emitting device 100 includes a substrate 20, the LED 10 and an optical lens 30 fixed on the substrate 20, a reflector plate 36 is arranged on one side of the substrate 20 where the LED 10 is fixed. The LED 10 includes a light emitting surface 101, the optical lens 30 arranged above the light emitting surface 101 is a rotating symmetric body, the optical lens 30 includes a light incident surface 31, a light emergent surface 32, a bottom surface 33 connected with the light incident surface 31 and the light emergent surface 32, the light incident surface 31 including a free-form concave surface, the light emergent surface 32 including a free-form convex surface 320 and a straight surface 34.

Figure 9:
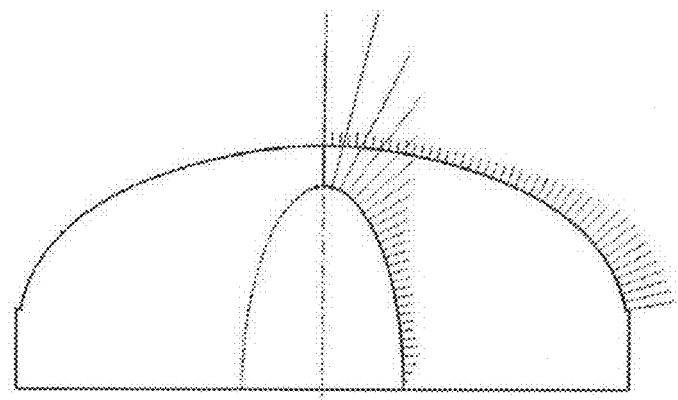
FIG. 9 is a schematic diagram of curvature variation on the light emergent surface and the light incident surface in FIG. 5.

Also as combination with FIG. 9, there is a first angle 40 between the symmetry axis 11 and the connecting line between the center point of the luminous surface 101 and any point on the light incident surface 31, and the curvature of the light incident surface 31 decreases with the increase of the first angle 40; there is a second angle between the symmetry axis 11 and the connecting line between the center point of the light emitting surface 101 and any point on the light emergent surface 32, and the curvature of the light emergent surface 32 increases with the increase of the second angle 41; the first angle 40 and the second angle 41 are not greater than 90°.

It needs to be noted that FIG. 9 only schematically shows the curvature variation on the light emergent surface and the light incident surface, a longer line segment represents a greater curvature, and for the curvature values of the light emergent surface and the light incident surface, the actual calculation value shall prevail.

As shown in FIG. 5, the distance between the point where the light incident surface 31 intersects with the symmetry axis 11 of the optical lens 30 and the point where the light emergent surface 32 intersects with the symmetry axis 11 of the optical lens 30 (i.e. the first distance 42) is 1.24 mm, the maximum distance between any point on the light incident surface 32 and the symmetry axis 11 of the optical lens 30 (i.e. the second distance 43) is 7.75 mm, the minimum distance between the bottom surface 33 and the substrate 20 (i.e. the third distance 44) is 0.72 mm, and the maximum distance between any point on the light emergent surface 32 and the substrate 20 (i.e. the fourth distance 45) is 6.81 mm.

The bottom surface of the optical lens may be in a frosted structure surface, the optical lens may be made of glass or transparent resin, such as polymethylmethacrylate, polycarbonate and the like.

Figure 10:
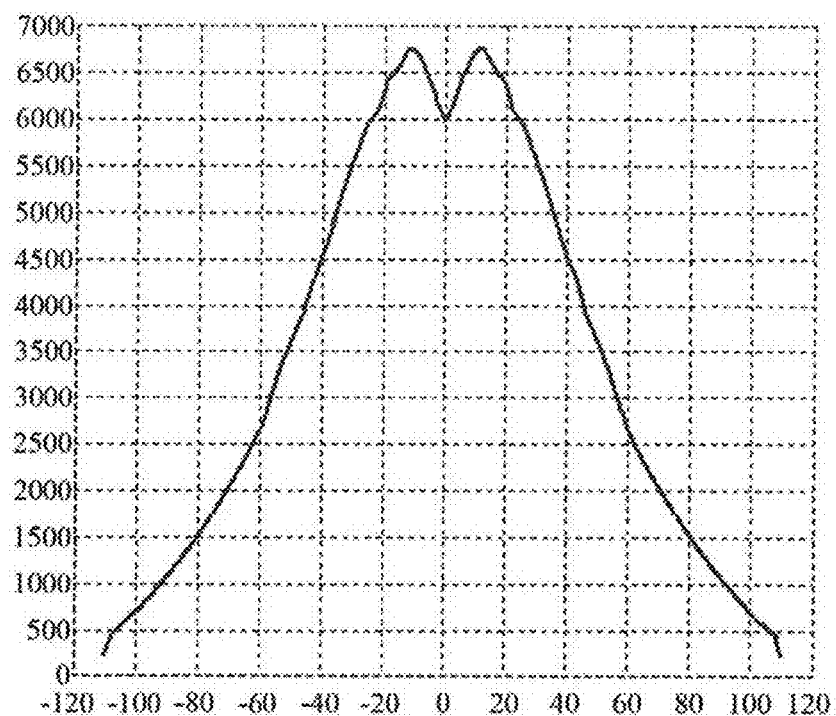
FIG. 10 is an illumination curve graph of the light emitting device of FIG. 5 illuminating the receiving surface parallel to and 25 mm from the reflecting surface.

In the case where no diffusion, antireflective film or other optical diaphragm/film is added, the illumination curve graph of the light emitting device according to the embodiment of the present disclosure illuminates the receiving surface parallel to and 25 mm in from the reflecting surface, as shown in FIG. 10; in comparison with the illumination curve graph shown in FIG. 3, in the illumination curve graph of the light emitting device according to the embodiment of the present disclosure, the illuminance value in the area of approximately 10 mm-50 mm is smooth in transition, no excessive fluctuations.

Figure 11:
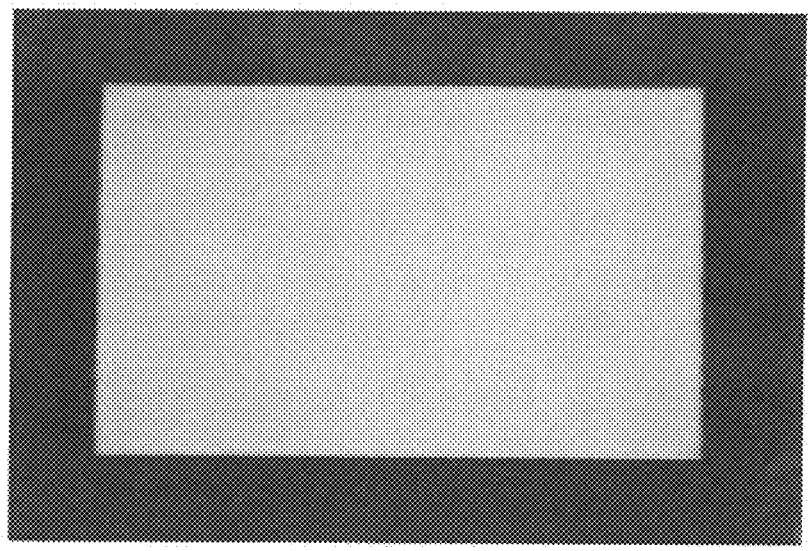
FIG. 11 is a spot distribution diagram of a backlight formed by the light emitting device of FIG. 5 illuminating the receiving surface parallel to and 25 mm from the reflecting surface.

In the same condition as above, a schematic distribution diagram of spots on the receiving surface of the backlight source formed by the light emitting device according to the embodiment of the present disclosure is as shown in FIG. 11, it can be seen from the figure that the light emitted by the backlight source formed by the light emitting device according to the embodiment of the present disclosure generates a uniform illuminance distribution on the whole receiving surface, no bright spot or bright ring caused by a too steep drop of the illumination curve appears.

Figure 12:
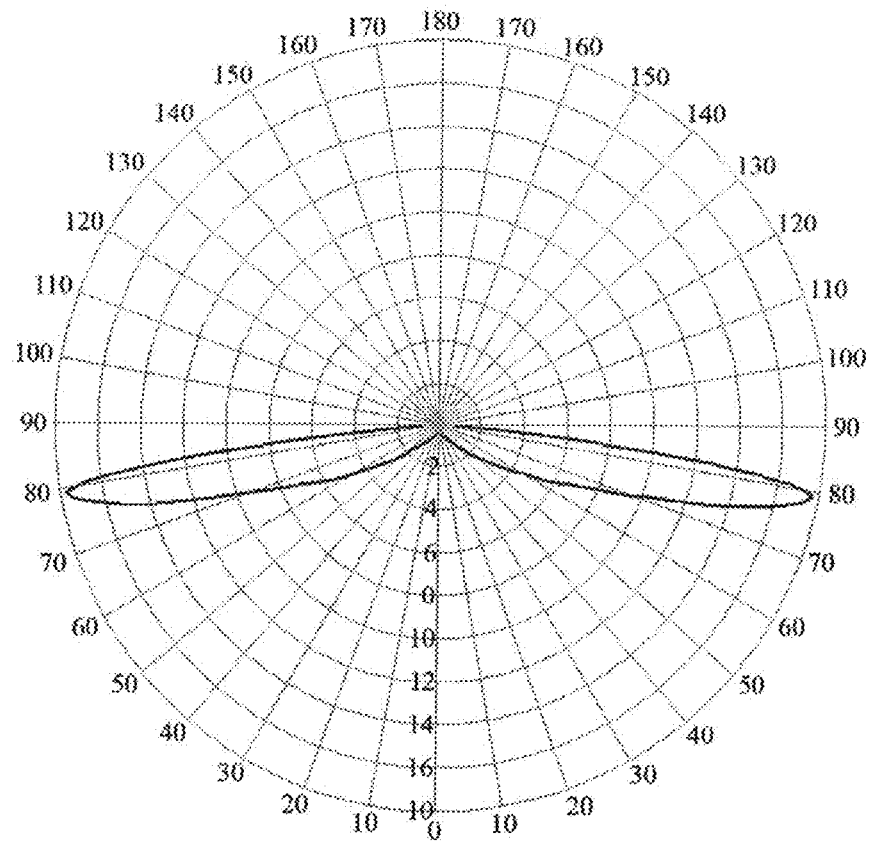
FIG. 12 is an illumination curve graph of the reflecting surface with the light emitting device of FIG. 5 illuminating the receiving surface parallel to and 25 mm from the reflecting surface.
Figure 13:
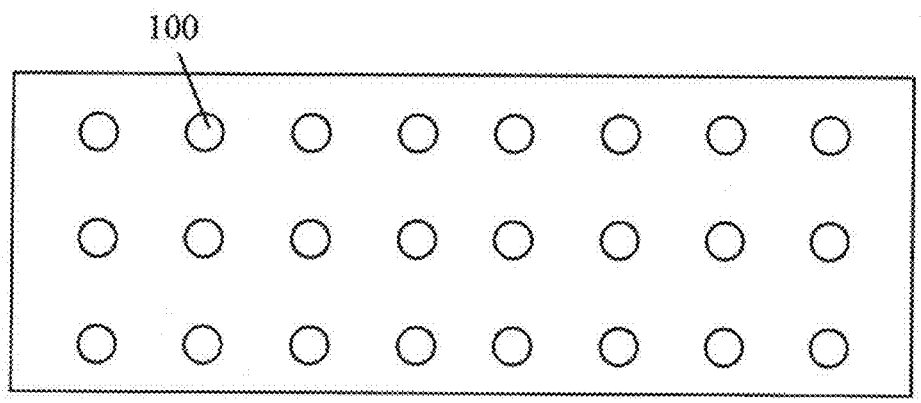
FIG. 13 is a schematic diagram of a backlight source according to an embodiment of the present disclosure.

In the same condition as above, a light intensity distribution diagram of the light emitting device according to the embodiment of the present disclosure is as shown in FIG. 12, the peak light intensity distribution angle has reached 78°, then the light emergent angle is 156°, far more than the light emergent angle the prior art can reach, for example 140° provided by FIG. 4.

In the embodiments of the present disclosure, the light incident surface of an optical lens is configured to be a free-form concave surface to enable the light emitted by the LED is deflected for one time, so that the brightness of the center of the light is reduced, and the curvature of the light incident surface decreases with the increase of the first angle, so the light close to the symmetry axis region has a relatively large deflection angle after going through the light incident surface with high curvature, thus the light close to the symmetry axis region is further scattered, the light intensity distribution tends to be even so as to realize the smooth transition of the illuminance. In addition, the light emergent surface of the optical lens is configured as a free-form convex surface, the curvature of the light emitting surface increases with the increase of the second angle, so that after the light goes through the light emergent surface with different curvatures, the light intensity distribution is more uniform, and the scattering angle increases, and then the diffusion range of light increases, that is the light emergent angle increases, thus improving the problems wherein the light emergent angle of the light emitting device is small, a bright spot, a bright ring and other forms of uneven display brightness appear on the display screen when the light emitting device is applied to the backlight source in the prior art.

The embodiments of the present disclosure further provide a backlight source, including the light emitting device above. The backlight source may provide a light source for the LCD and a TV, a digital camera, a mobile phone, a tablet computer and other products or components including the LCD.

Particularly, a backlight source may be formed by light emitting devices in a matrix arrangement, the number and arrangement mode of the luminescent device forming the backlight are not limited by the embodiments of the present disclosure, an illustration is made by only taking the backlight formed in this matrix arrangement as an example.

Figure 14:
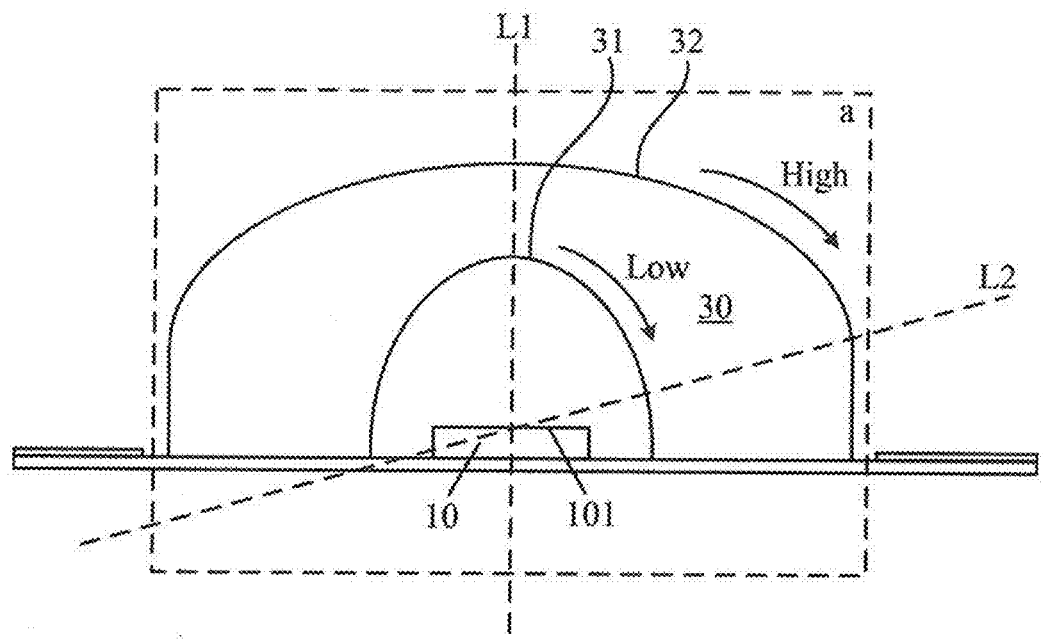
FIG. 14 is a schematic structural diagram of an embodiment of the present disclosure.

In an embodiment of the present disclosure, as shown in FIG. 14, the light emitting device includes a light emitting source 10, a light emitting surface 101, and an optical lens 30 arranged above the light emitting source 10. The optical lens 30 includes a light incident surface 31 and a light emergent surface 32, the light incident surface 31 and light emergent surface 32 being both curved surfaces. The plane a in the figure is perpendicular to the light emitting surface 101. In the plane a, the curvature variation trends of the parts of the light incident surface 31 and the light emergent surface 32 between the straight lines L1 and L2 are opposite to each other. For example, the curvature variation of the part the light incident surface 31 between L1 and L2 as shown in the figure is a fall from top to bottom, whereas the curvature variation of the part of the light emergent surface 32 between L1 and L2 is a rise from bottom to top.

The parts of the light incident surface 31 and the light emitting surface 32 between the L1 and L2 on the plane may be only a part thereof. And the optical lens 30 being above the light emitting source 10 may refer to the case where the light emitted by the light emitting surface 101 of the light emitting source 10 may illuminate the light incident surface 31 of the optical lens 30 without refraction or reflection.

Figure 15:
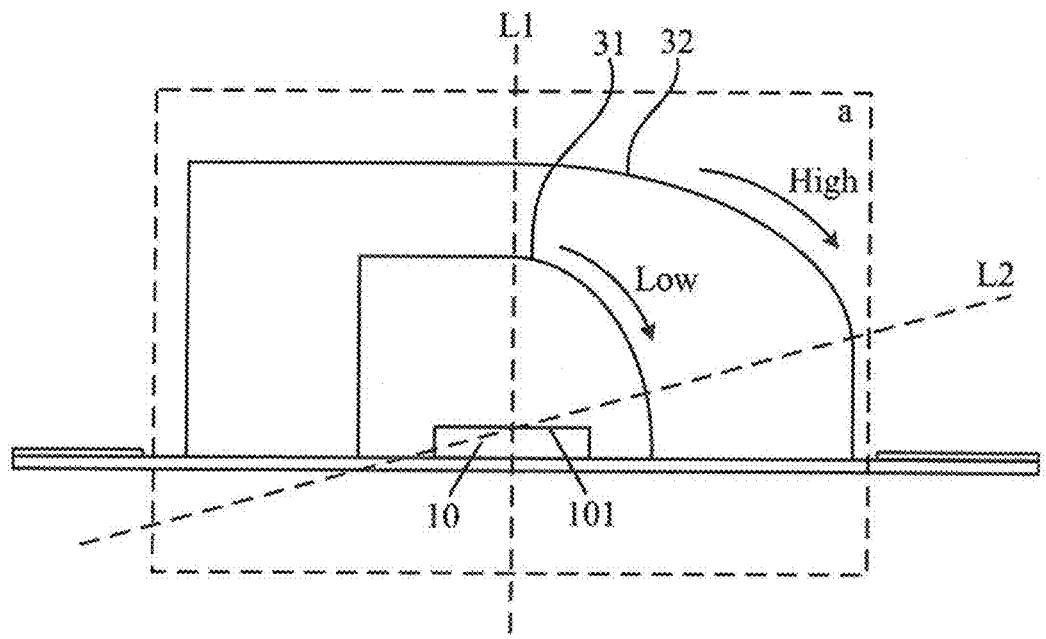
FIG. 15 is a schematic structural diagram of another embodiment of the present disclosure.

Another embodiment of the present disclosure is as shown in FIG. 15. The difference between it and the embodiment shown in FIG. 14 at least lies in that the optical lens 30 is not a totally symmetric revolving body; as seen in FIG. 15, at the left side, the curvature of the light incident surface is consistent, and the curvature of the light emergent surface is consistent.

Figure 16:
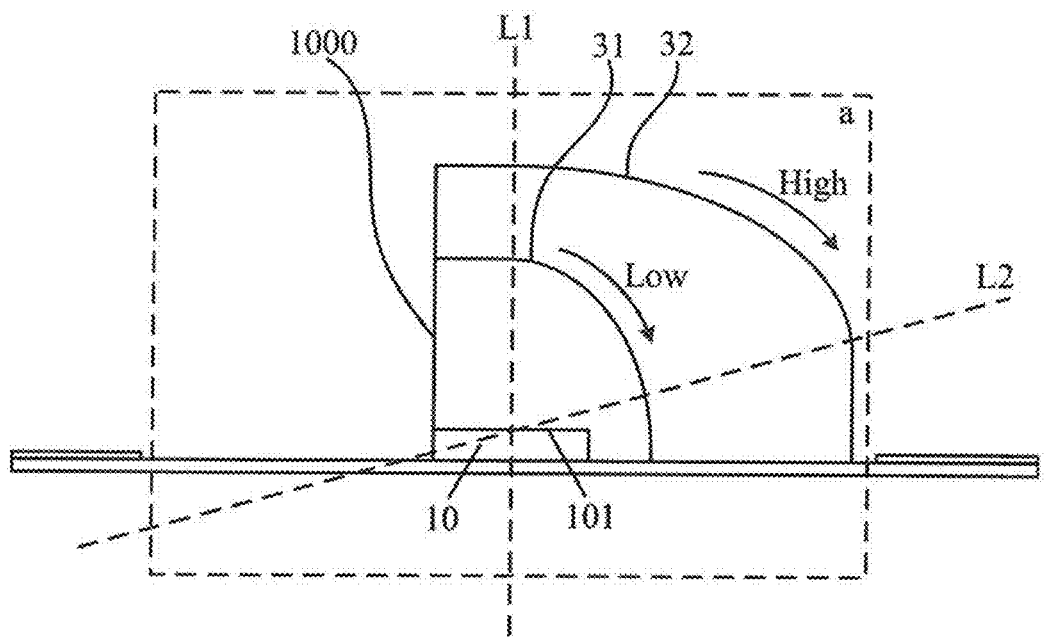
FIG. 16 is a schematic structural diagram of still another embodiment of the present disclosure.

Another embodiment of the present disclosure is as shown in FIG. 16. The difference between it and the embodiment as shown in FIG. 14 at least lies in that the optical lens 30 is not a revolving body, the left and right sides are not symmetrical in FIG. 16, whereas reference numeral 1000 refers to an opaque surface.

The present disclosure further provides a display equipment, which may use a light emitting device according to any embodiment above.

The above mentioned are only specific embodiments of the present disclosure; however, the protection scope of the present disclosure is not limited thereto. For any of those skilled in the art, within the technical scope disclosed by the present disclosure, variations or substitutions can be easily conceived, and should fall within the protection scope of the present disclosure. Therefore, for the protection scope of the present disclosure, the protection scope of the claims should prevail.

The invention claimed is:

1. A light emitting device, comprising a light emitting diode (LED) and an optical lens, the LED comprising a light emitting surface, the optical lens being a rotating symmetric body arranged above the LED, the optical lens comprising a light incident surface and a light emergent surface, wherein the light incident surface comprises a free-form concave surface, and the light emergent surface comprises a free-form convex surface; wherein:

in the case where a symmetry axis of the optical lens goes through a centre point of the light emitting surface of the LED, there is a first angle formed between the symmetry axis and a connecting line between the center point of the light emitting surface and any point on the light incident surface, and a curvature of the light incident surface decreases with an increase of the first angle;

there is a second angle between the symmetry axis and a connecting line between the center point of the light emitting surface and any point on the light emergent surface, and a curvature of the light emergent surface increases with an increase of the second angle, wherein the first angle and the second angle are not greater than 90%;

the optical lens further comprises a bottom surface connecting the light incident surface and the light emergent surface;

the light emergent surface further comprises an inward inclined surface, a generatrix extension line of the inward inclined surface intersects with the symmetry axis of the optical lens; the inward inclined surface is connected with the bottom surface;

the light emitting device further comprises a substrate;

supporting feet are arranged on the bottom surface to support the optical lens, so that the optical lens is separated by a certain space from the substrate.

2. The light emitting device according to claim 1, wherein a reflector plate is arranged on the inward inclined surface.

3. The light emitting device according to claim 1, wherein the LED is fixed on the substrate, a reflector plate is arranged on one side of the substrate where the LED is fixed.

4. The light emitting device according to claim 1, wherein a distance between a point where the light incident surface intersects with the symmetry axis of the optical lens and a point where the light emergent surface intersects with the symmetry axis of the optical lens is a first distance, 0.5 mm≤the first distance≤1.5 mm.

5. The light emitting device according to claim 1, wherein a maximum distance between any point on the light emergent surface and the symmetry axis of the optical lens is a second distance, 6.5 mm≤the second distance≤8.5 mm.

6. The light emitting device according to claim 3, wherein a minimum distance between the bottom surface and the substrate is a third distance, 0.2 mm≤the third distance≤1 mm.

7. The light emitting device according to claim 6, wherein a height of the LED is less than the third distance.

8. The light emitting device according to claim 3, wherein a maximum distance between any point on the light emergent surface and the substrate is a fourth distance, the fourth distance≤6.5 mm.

9. The light emitting device according to claim 1, wherein the light emergent surface further comprises a straight surface, wherein a straight generatrix of the straight surface is in parallel to the symmetry axis of the optical lens; the straight surface is connected with the bottom surface.

10. A display equipment, comprising a light emitting source and an optical lens, the light emitting source comprising a light emitting surface, the optical lens being a rotating symmetric body arranged above the light emitting source, the optical lens comprising a light incident surface and a light emergent surface, wherein the light incident surface comprises a free-from concave surface, and the light emergent surface comprises a free-form convex surface;

in the case where a symmetry axis of the optical lens goes through a centre point of the light emitting surface of the light emitting source, there is a first angle between the symmetry axis and a connecting line between the center point of the light emitting surface and any point on the light incident surface, and a curvature of the light incident surface decreases with an increase of the first angle;

there is a second angle between the symmetry axis and a connecting line between the center point of the light emitting surface and any point on the light emergent surface, and a curvature of the light emergent surface increases with an increase of the second angle;

the optical lens further comprises a bottom surface connecting the light incident surface and the light emergent surface;

the light emergent surface further comprises an inward inclined surface, a generatrix extension line of the inward inclined surface intersects with the symmetry axis of the optical lens; the inward inclined surface is connected with the bottom surface;

supporting feet are arranged on the bottom surface to support the optical lens, so that the optical lens is separated by a certain space from the substrate.

11. A light emitting device, comprising a light emitting diode (LED) and an optical lens, the LED comprising a light emitting surface, the optical lens being a rotating symmetric body arranged above the LED, the optical lens comprising a light incident surface and a light emergent surface, wherein the light incident surface comprises a free-form concave surface, and the light emergent surface comprises a free-form convex surface; wherein:

in the case where a symmetry axis of the optical lens goes through a centre point of the light emitting surface of the LED, there is a first angle formed between the symmetry axis and a connecting line between the center point of the light emitting surface and any point on the light incident surface, and a curvature of the light incident surface decreases with an increase of the first angle;

there is a second angle between the symmetry axis and a connecting line between the center point of the light emitting surface and any point on the light emergent surface, and a curvature of the light emergent surface increases with an increase of the second angle, wherein the first angle and the second angle are not greater than 90°;

the optical lens further comprises a bottom surface connecting the light incident surface and the light emergent surface;

the light emitting device further comprises a substrate;

a distance between a point where the light incident surface intersects with the symmetry axis of the optical lens and a point where the light emergent surface intersects with the symmetry axis of the optical lens is a first distance, 0.5 mm≤the first distance≤1.5 mm;

a maximum distance between any point on the light emergent surface and the symmetry axis of the optical lens is a second distance, 6.5 mm≤the second distance≤8.5 mm;

a minimum distance between the bottom surface and the substrate is a third distance, 0.2 mm≤the third distance≤1 mm;

a maximum distance between any point on the light emergent surface and the substrate is a fourth distance, the fourth distance≤6.5 mm.

12. The light emitting device according to claim 11, wherein the light emergent surface further comprises an inward inclined surface, a generatrix extension line of the inward inclined surface intersects with the symmetry axis of the optical lens; the inward inclined surface is connected with the bottom surface;

supporting feet are arranged on the bottom surface to support the optical lens, so that the optical lens is separated by a certain space from the substrate.

* * * * *